US 7,001,696 B2

(12) United States Patent
Inao et al.

(10) Patent No.: US 7,001,696 B2
(45) Date of Patent: Feb. 21, 2006

(54) NEAR-FIELD LIGHT EXPOSURE MASK WITH AVOIDANCE OF OVERLAP OF NEAR-FIELD LIGHT, METHOD FOR MANUFACTURING THE SAME, EXPOSURE APPARATUS AND METHOD USING NEAR-FIELD LIGHT EXPOSURE MASK, AND METHOD FOR MANUFACTURING DEVICE

(75) Inventors: Yasuhisa Inao, Kanagawa (JP); Ryo Kuroda, Kanagawa (JP)

(73) Assignee: Canon Kabushiki Kaisha, Tokyo (JP)

( * ) Notice: Subject to any disclaimer, the term of this patent is extended or adjusted under 35 U.S.C. 154(b) by 263 days.

(21) Appl. No.: 10/449,505

(22) Filed: Jun. 2, 2003

(65) Prior Publication Data

US 2003/0232257 A1    Dec. 18, 2003

(30) Foreign Application Priority Data

Jun. 14, 2002    (JP)   ............................ 2002-175118

(51) Int. Cl.
     *G01F 9/00*      (2006.01)
(52) U.S. Cl. ........................................................ 430/5
(58) Field of Classification Search ................ 430/5, 430/30, 322; 355/53, 73, 76
See application file for complete search history.

(56) References Cited

U.S. PATENT DOCUMENTS

| 6,171,730 | B1 | 1/2001 | Kuroda et al. ................ 430/5 |
| 6,187,482 | B1 | 2/2001 | Kuroda et al. ................ 430/5 |
| 2001/0046719 | A1 | 11/2001 | Yamaguchi et al. .......... 438/11 |
| 2002/0071106 | A1 | 6/2002 | Yano et al. ................... 355/53 |
| 2004/0080732 | A1 * | 4/2004 | Kuroda et al. ............... 355/53 |

FOREIGN PATENT DOCUMENTS

| JP | 11-145051 | 5/1999 |
| JP | 11-184094 | 7/1999 |

* cited by examiner

*Primary Examiner*—S. Rosasco
(74) *Attorney, Agent, or Firm*—Fitzpatrick, Cella, Harper & Scinto

(57) ABSTRACT

A near-field light exposure mask provided with a plurality of apertures each having a width smaller than the wavelength of light used for exposure. In the mask described above, among the plurality of apertures, apertures adjacent to each other are disposed at a necessary distance so that near-field light effused from one of the apertures adjacent to each other does not overlap that generated from the other aperture.

20 Claims, 6 Drawing Sheets

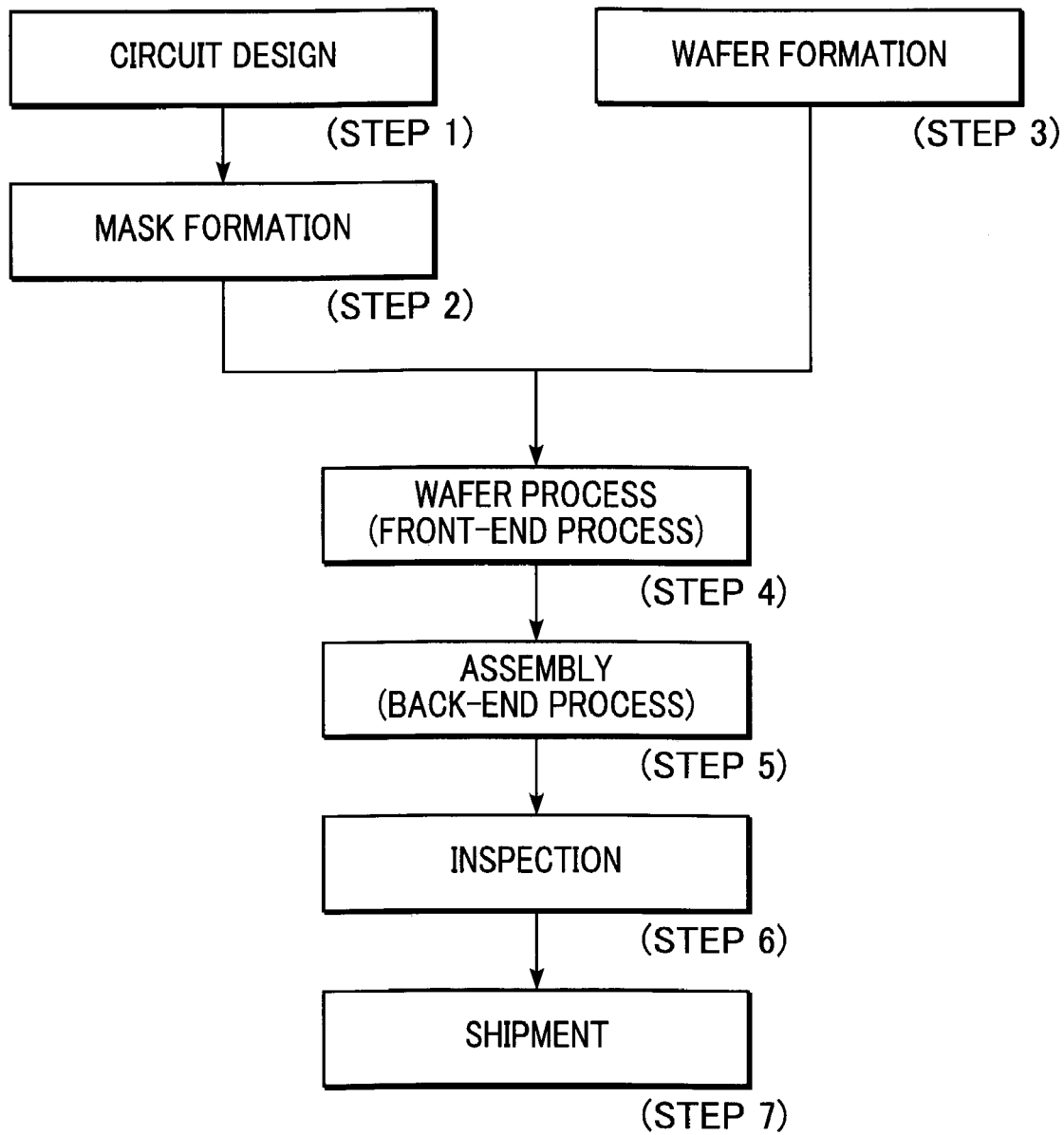

NEAR-FIELD LIGHT EXPOSURE MASK WITH AVOIDANCE OF OVERLAP OF NEAR-FIELD LIGHT, METHOD FOR MANUFACTURING THE SAME, EXPOSURE APPARATUS AND METHOD USING NEAR-FIELD LIGHT EXPOSURE MASK, AND METHOD FOR MANUFACTURING DEVICE

BACKGROUND OF THE INVENTION

1. Field of the Invention

The present invention relates to near-field light exposure masks, methods for manufacturing near-field light exposure masks, exposure apparatuses and methods using the near-field light exposure masks, and methods for manufacturing devices. In particular, the present invention relates to a near-field light exposure mask used for exposing a workpiece (the workpiece including a single crystal substrate such as a semiconductor wafer, a glass substrate for a liquid crystal display (LCD), or the like), a method for manufacturing a near-field light exposure mask, an exposure apparatus and method using the near-field light exposure mask mentioned above, and a method for manufacturing a device.

2. Related Background Art

In recent years, due to the trend toward miniaturization of electronic apparatuses and decrease in thickness thereof, techniques for forming high-density semiconductor devices to be mounted on electronic apparatuses have been increasingly demanded. For example, concerning the design rule for a pattern of a mask or a reticle, the size of line and space (L & S) used in mass production processes has been decreased close to 130 nm and, in addition, has been expected to be continuously decreased. The L & S is an image projected on a wafer in exposure, in which the image has the line width equal to the space width, and indicates the resolution of the exposure.

A projection exposure apparatus, which has been predominantly used in recent years, comprises (a) an illumination optical system illuminating a mask by using light flux emitted from a light source, and (b) a projection optical system provided between the mask and a workpiece which is to be exposed. In the illumination optical system, in order to obtain an area having uniform illuminance distribution, light flux emitted from the light source is introduced into a light integrator such as a fly-eye lens composed of a plurality of rod lenses, and the mask surface is illuminated in Koehler illumination by a condenser lens using a surface of the light integrator as a secondary light-emitting surface.

Resolution R of a projection exposure apparatus is represented by the following equation using a wavelength λ of a light source and the numerical aperture (NA) of the exposure apparatus:

$$R = k_1 \times \frac{\lambda}{NA} \quad \text{[Equation 1]}$$

where $K_1$ is a constant.

Accordingly, when the wavelength is decreased, and when the NA is increased, the resolution is improved.

In addition, the range of focus, which can maintain imaging characteristics at a certain level, is referred to as a depth of focus (DOF), and the depth of focus DOF can be represented by the following equation:

$$DOF = k_2 \times \frac{\lambda}{NA^2} \quad \text{[Equation 2]}$$

where $K_2$ is a constant.

Accordingly, when the wavelength is decreased, and when the NA is increased, the depth of focus becomes smaller. When the depth of focus becomes smaller, focusing becomes difficult, and as a result, improvements in substrate flatness and focus accuracy are required. Hence, a larger depth of focus is preferable in general.

It is understood from Equations 1 and 2 that a decrease in wavelength is more effective than an increase in NA. Hence, as a recent light source, conventional ultra high pressure mercury lamps have been replaced by a KrF excimer laser (wavelength of approximately 248 nm) or an ArF excimer laser (wavelength of approximately 193 nm), each of which has a wavelength shorter than that of the conventional mercury lamps described above.

However, the values of the constants k1 and k2 are generally from approximately 0.5 to 0.7, and even when a method for improving the resolution, such as a phase shift method, is used, since these constants may only become approximately 0.4, it has been difficult to improve the resolution by decreasing the constants.

In addition, it has been generally believed that the wavelength of a light source is the limitation on resolution of a projection exposure apparatus, and even when an excimer laser is used, it has been difficult for a projection exposure apparatus to form a pattern having a dimension of 0.10 μm or less. In addition, even if a light source having a shorter wavelength is present, an optical material (that is, a glass material for a lens) may not be able to transmit exposure light having the shorter wavelength described above, and as a result, a problem may arise in that exposure cannot be performed (that is, projection cannot be performed for a workpiece). That is, the transmittances of substantially all glass materials are close to zero in the far ultraviolet region.

In addition, although synthetic quartz produced by a specific production method may be applied to exposure which uses exposure light having a wavelength of approximately 248 nm, when the wavelength becomes 193 nm or less, the transmittance of the synthetic quartz is rapidly decreased. Hence, it has been very difficult to develop a practical glass material having a sufficiently high transmittance for exposure light having a wavelength of 150 nm or less, which can be used for forming a fine pattern having a dimension of 0.10 μm or less. Furthermore, since a glass material used in the far ultraviolet region is expected to satisfy certain levels of various properties, such as durability, refractive index, uniformity, optical stress, and workability, in addition to the transmittance described above, the development of a practical glass material has not been easily carried out.

In order to solve the problems described above, an exposure apparatus has been recently proposed which uses the principle of a scanning near-field microscope (SNOM) as means for performing microfabrication in which a dimension of 0.1 μm or less can be achieved.

As a near-field light exposure apparatus, for example, an apparatus may be mentioned in which a mask having an aperture having a dimension of 100 nm or less is placed at a distance of 100 nm or less from a workpiece and in which the workpiece is then exposed with near-field light effused from the aperture. In addition to the apparatus described above, in Japanese Laid-Open Patent Application Nos. 11-145051 and 11-184094, an apparatus has been proposed in which a mask elastically deformable in the direction normal to the surface thereof is closely brought into contact with a resist, and in which, by using near-field light effused from a fine aperture pattern having a dimension of 100 nm or less formed in the mask surface, exposure exceeding the limitation of the light wavelength is performed selectively for the workpiece. According to the publications described above, as means for contacting the mask closely with the resist, the structure is formed in which the difference in pressure is generated between two positions, that is, the front surface side of the mask and the rear surface side thereof, so that the elastically deformable mask is closely brought into contact with the resist, and subsequently, near-field light exposure is performed. As a result, a fine pattern having a dimension of 100 nm or less can be uniformly and simultaneously transferred to the entire surface of the resist on the substrate.

However, although the exposure apparatus using near-field light, described above, is used, when finer patterns having dimensions of 100 nm, 50 nm, and 30 nm are progressively realized, in the L & S mask pattern which is one of the indexes indicating the resolution, the aspect ratio of a resist pattern obtained after development is decreased. Hence, in view of the problem described above, the exposure apparatus using near-field light admits of improvement.

Referring to FIGS. 4A to 4C, the phenomenon described above will be illustrated. FIG. 4A is a view showing the case in which the width of an aperture in a near-field light exposure mask is larger than or equal to the distance between adjacent apertures.

When light for exposure is radiated from above the mask shown in FIG. 4A, the light thus radiated is transmitted as surface plasmons in the aperture having a width smaller than the wavelength. At this stage, the intensity of near-field light exhibits the strongest peaks at two side edge positions of the aperture at the shading film surface side. The intensity of the near-field light is isotropically decreased along the direction away from each edge portion, and at a position at a distance of approximately 100 nm therefrom, the intensity is decreased substantially to zero. This intensity distribution is shown by isointensity lines 110 of the near-field light in FIG. 4A. Since the near-field light generated from one aperture overlaps that from another aperture adjacent thereto, the intensity of the near-field light under the shading film is increased. Accordingly, the difference in intensity of the near-field light between under the aperture and under the shading film is decreased, and as a result, the structure formed in the resist has a smaller aspect ratio. In this case, the resist does not have enough durability as an etching mask, and as a result, a workpiece present thereunder cannot be processed.

SUMMARY OF THE INVENTION

Accordingly, the present invention was made to solve the problems described above, and an object of the present invention is to provide a near-field light exposure mask by which a resist pattern having a high aspect ratio can be obtained even when a finer mask pattern is progressively realized. In addition, the present invention provides a method for manufacturing a near-field light exposure mask, an exposure apparatus and a method using the near-field light exposure mask described above, and a method for manufacturing a device.

To these ends, the present invention provides a near-field light exposure mask, a method for manufacturing a near-field light exposure mask, an exposure apparatus and a method using the near-field light exposure mask described above, and a method for manufacturing a device, which have the following structures (1) to (11).

(1) A near-field light exposure mask of the present invention comprises a plurality of apertures each having a width smaller than the wavelength of light used for exposure; wherein, among said plurality of apertures, apertures adjacent to each other are disposed at a predetermined distance so that near-field light generated from one of said apertures does not overlap that generated from the other aperture.

(2) In the near-field light exposure mask described in the above (1), the width of each of the apertures is preferably 50% or less of the total length (i.e., the sum) of (a) the width of each of the apertures and (b) the distance between the apertures adjacent to each other.

(3) In the near-field light exposure mask described in the above (1) or (2), the width of each of the apertures is preferably 50 nm or less.

(4) In the near-field light exposure mask described in the above (1) or (2), the total length (i.e., the sum) of (a) the width of each of the apertures and the (b) distance between the apertures adjacent to each other is preferably 200 nm or less.

(5) In the near-field light exposure mask described in the above (1) or (2), each of the apertures formed in the mask may have a width smaller than the wavelength and may have a length larger than the wavelength in the direction perpendicular to the width.

(6) A method for manufacturing one of the near-field exposure masks described in the above (1) to (5), comprises: a step of obtaining a spread of near-field light effused from each of the apertures formed in the mask; and a step of forming the width of each of the apertures so as to correct the spread of the near-field light.

(7) An exposure apparatus comprises a near-field light exposure mask provided with apertures therein, in which a workpiece is exposed by near-field light effused from each of the apertures, wherein the near-field light exposure mask is one of the near-field light exposure masks described in the above (1) to (5).

(8) An exposure method using a near-field light exposure mask provided with apertures therein, comprises the steps of disposing the near-field light exposure mask close to a workpiece at a distance of 100 nm or less, and exposing the workpiece using near-field light effused from the apertures, wherein the near-field light exposure mask is one of the near-field light exposure masks described in the above (1) to (5).

(9) In the exposure method described in the above (8), the thickness of the workpiece is preferably 50% or less of the total length (i.e., the sum) of (a) the width of each of the apertures of the mask and (b) the distance between the apertures adjacent to each other.

(10) In the exposure method described in the above (8), the workpiece may be partly exposed in the thickness direction.

(11) A method for manufacturing a device comprises (a) a step of exposing a workpiece using the exposure apparatus described in the above (7) or one of the exposure methods described in the above (8) to (10); and (b) a step of developing the workpiece.

In yet another aspect, the present invention relates to a near-field light exposure mask comprising a plurality of apertures, each having a width smaller than the wavelength of light used for exposure, wherein, among the plurality of apertures, apertures adjacent to each other are disposed at a predetermined distance so that near-field light generated from one of the apertures adjacent to each other does not overlap that generated from the other aperture of the apertures adjacent to each other.

In yet another aspect, the present invention relates to a method for manufacturing the above-discussed near-field light exposure mask, the method comprising (a) a step of obtaining a spread of near-field light effused from each of the apertures formed in a mask and (b) a step of forming the width of each of the apertures so as to correct the spread of the near-field light. The forming step may be effected with respect to a mask different from that used in the obtaining step.

In a still further aspect, the present invention relates to an exposure apparatus comprising a near-field light exposure mask provided with apertures therein, in which a workpiece is exposed by near-field light effused from each of the apertures, wherein the near-field light exposure mask is the above-discussed near-field exposure mask.

In another aspect, the present invention relates to an exposure method using a near-field light exposure mask provided with apertures therein, the method comprising the steps of (a) disposing the near-field light exposure mask close to a workpiece at a distance of 100 nm or less; and (b) exposing the workpiece using near-field light effused from the apertures, wherein the near-field light exposure mask is the above-discussed near-field light exposure mask.

In a still further aspect, the present invention relates to a method for manufacturing a device, the method comprising: (a) a step of exposing a workpiece using the above-discussed exposure apparatus; and (b) a step of developing the workpiece.

In yet another aspect, the present invention relates to a method for manufacturing a device, the method comprising: (a) a step of exposing a workpiece using the above-discussed exposure method; and (b) a step of developing the workpiece.

In another aspect, the present invention relates to a mask comprising a film having formed therein a plurality of apertures including a first aperture of width X and a second aperture of width X separated by a distance D, wherein X is smaller than the wavelength of light used for exposure, and wherein the following condition is satisfied: $X \leq (X+D)/2$. Preferably, $X \leq 50$ nm. Also, preferably $X+D \leq 200$ nm.

In a still further aspect, the present invention relates to an exposure apparatus comprising the aforementioned mask and means for exposing a workpiece with light effused from the plurality of apertures.

Further objects, features and advantages of the present invention will become apparent from the following description of the preferred embodiments with reference to the attached drawings.

BRIEF DESCRIPTION OF THE DRAWINGS

FIG. 4A is a view showing the case in which the width of an aperture in the near-field light exposure mask is larger than the distance between adjacent apertures so that near-field light generated from one aperture overlaps that from another aperture adjacent thereto; FIG. 4B is a view showing the case in which near-field light generated from one aperture does not overlap that generated from another aperture adjacent thereto; and FIG. 4C is a view showing the case in which the thickness of a resist is larger than 50% of a pitch Λ so that near-field light generated from one aperture overlaps that from another aperture adjacent thereto.

FIG. 5 is a flow chart for illustrating a method for manufacturing a device, the method including an exposure step performed by the exposure apparatus shown in FIG. 3.

DETAILED DESCRIPTION OF THE INVENTION

Figure 4A:
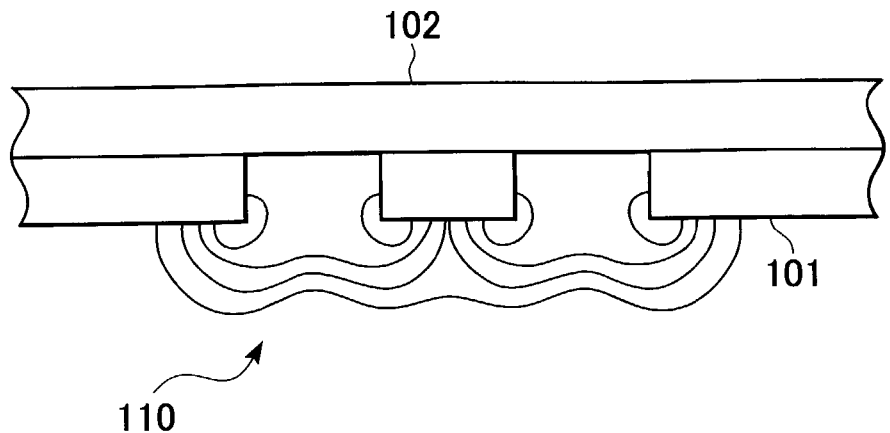
FIGS. 4A to 4C are views for illustrating a problem of a near-field light exposure mask.
Figure 4B:
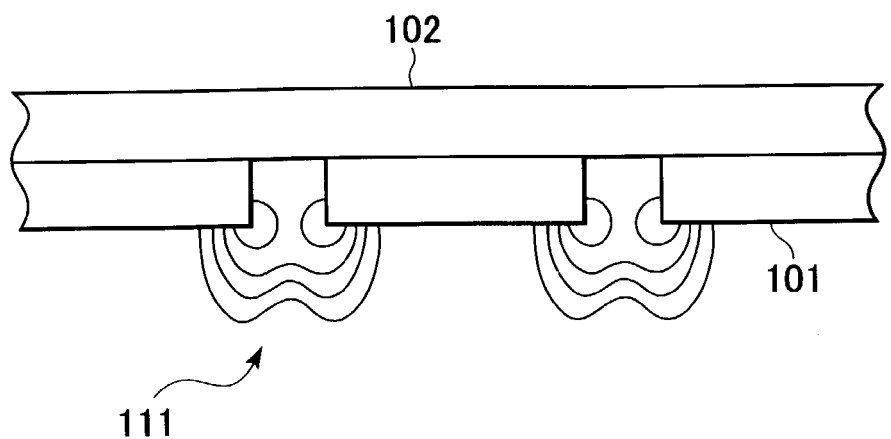

When a near-field light exposure mask having the structure described above (i.e., in the Summary of the Invention) is irradiated with exposure light emitted from a light source, in a manner different from the case using an L & S pattern in which the ratio of the width of an aperture to the distance between adjacent apertures is 1 to 1, near-field light generated from one aperture does not overlap that generated from another aperture adjacent thereto as shown by isointensity lines 111 in FIG. 4B, which overlap would thereby decrease the intensity of the near-field light under a shading portion. Hence, the intensity of the near-field light under the shading portion can be greatly different from that under the aperture portion, and as a result, even when a finer L & S pattern having a dimension of 50 nm or less is used, a resist structure having a large aspect ratio can be formed. Accordingly, a near-field light exposure mask can be provided capable of exposing a resist with a high resolution and of forming a resist pattern having a high aspect ratio and a high resolution. In addition, a method for manufacturing a near-field light exposure mask, an exposure apparatus and a method using a near-field light exposure mask, and a method of manufacturing a device also can be provided.

Figure 1:
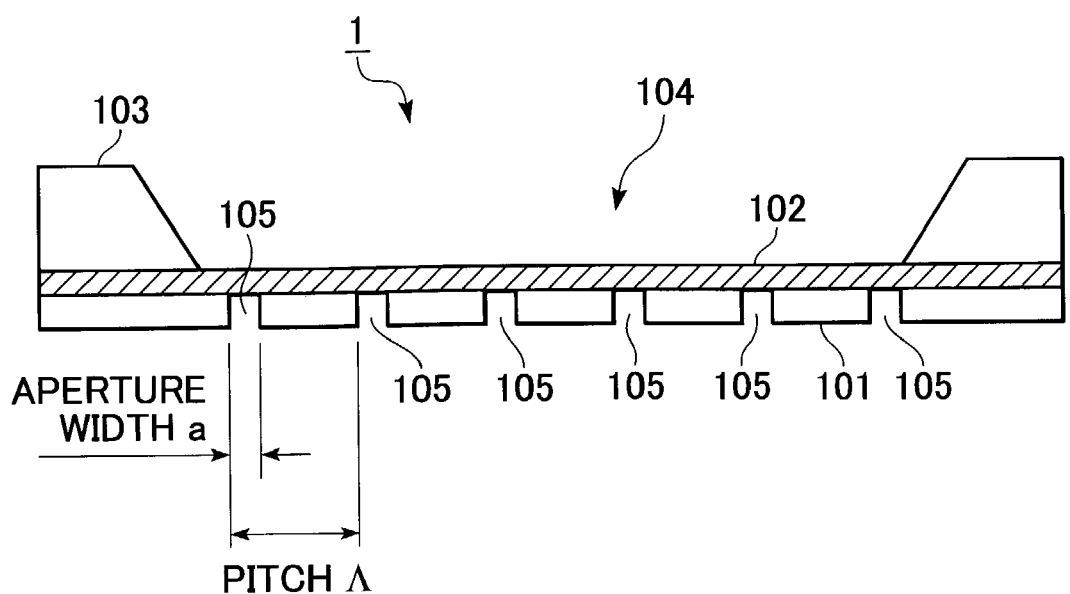
FIG. 1 is a schematic cross-sectional view showing an exposure mask of an embodiment according to the present invention.
Figure 2:
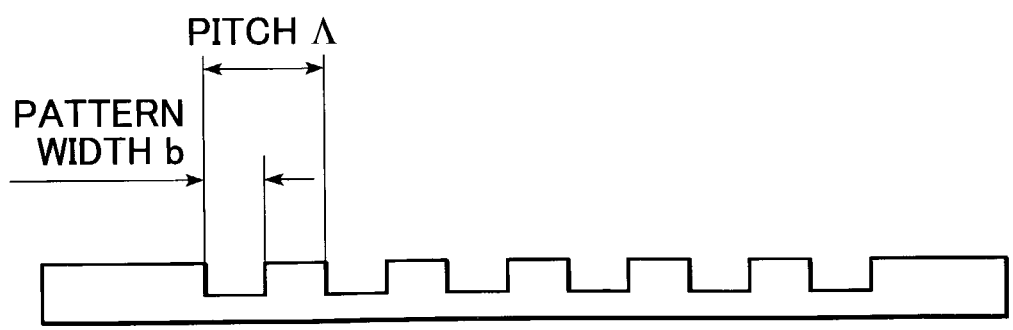
FIG. 2 is a view showing a resist pattern formed by using an exposure mask of an embodiment according to the present invention.

Hereinafter, referring to the figures, an exposure mask of an embodiment according to the present invention will be described. FIG. 1 is a schematic cross-sectional view showing an exposure mask 1 of this embodiment, and FIG. 2 is a view showing a resist pattern formed by using the exposure mask 1 of this embodiment. As shown in FIG. 1, the exposure mask 1 is composed of a shading film 101, a mask member 102, and a mask support 103. In addition, a thin film portion 104, which serves as an effective exposure mask for exposure and is composed of the shading film 101 and the mask member 102, is supported by the mask support 103. The shading film 101 is formed of a material, such as chromium (Cr), aluminum (Al), or gold (Au), having a low transmittance for the exposure light described later.

The mask member 102 is formed of a material, such as silicon nitride (SiN), silicon oxide (SiO$_2$), or silicon carbide (SiC), having properties different from those of the shading film 101 and having a transmittance for the exposure light described later. In the shading film 101 apertures 105 in the form of a slit or circle are formed. The apertures are formed in the thin film portion that is formed only from the shading film 101 and the mask member 102. These apertures 105 are formed for generating near-field light in front of the mask by radiating exposure light from the rear surface side (upper side in FIG. 1) of the mask as described later. In addition to the thin film portion, the apertures 105 may also be formed in a part of the mask support 103 supporting the thin film portion.

The apertures 105 formed in the part of the mask support 103 do not contribute to the generation of the near-field light and are used for different purposes of serving as alignment markers, distance sensors, or the like. When the width of fine grooves or apertures required for a resist pattern formed in a workpiece is 100 nm or less, the apertures in the form of a slit or circle provided in the exposure mask 1 are formed so as to have a width smaller than that of the resist pattern by a few to a few tens of nanometers. When a line & space resist pattern having a pitch $\Lambda$ and a pattern width b=$\Lambda$/2 as shown in FIG. 2 is formed, a pitch $\Lambda$ between the apertures of the exposure mask 1 is formed equal to the pitch required for the resist pattern; however, a width of "a" of the aperture is formed so as to be 50% or less of the pitch as shown in FIG. 1. That is, the width of the aperture is determined so as to satisfy the relationship in which the width of the aperture is 50% or less of the pitch. Accordingly, near-field light generated from one aperture does not overlap that generated from another aperture adjacent thereto, and a decrease in intensity of the near-field light under the shading portion can be effectively achieved.

Figure 3:
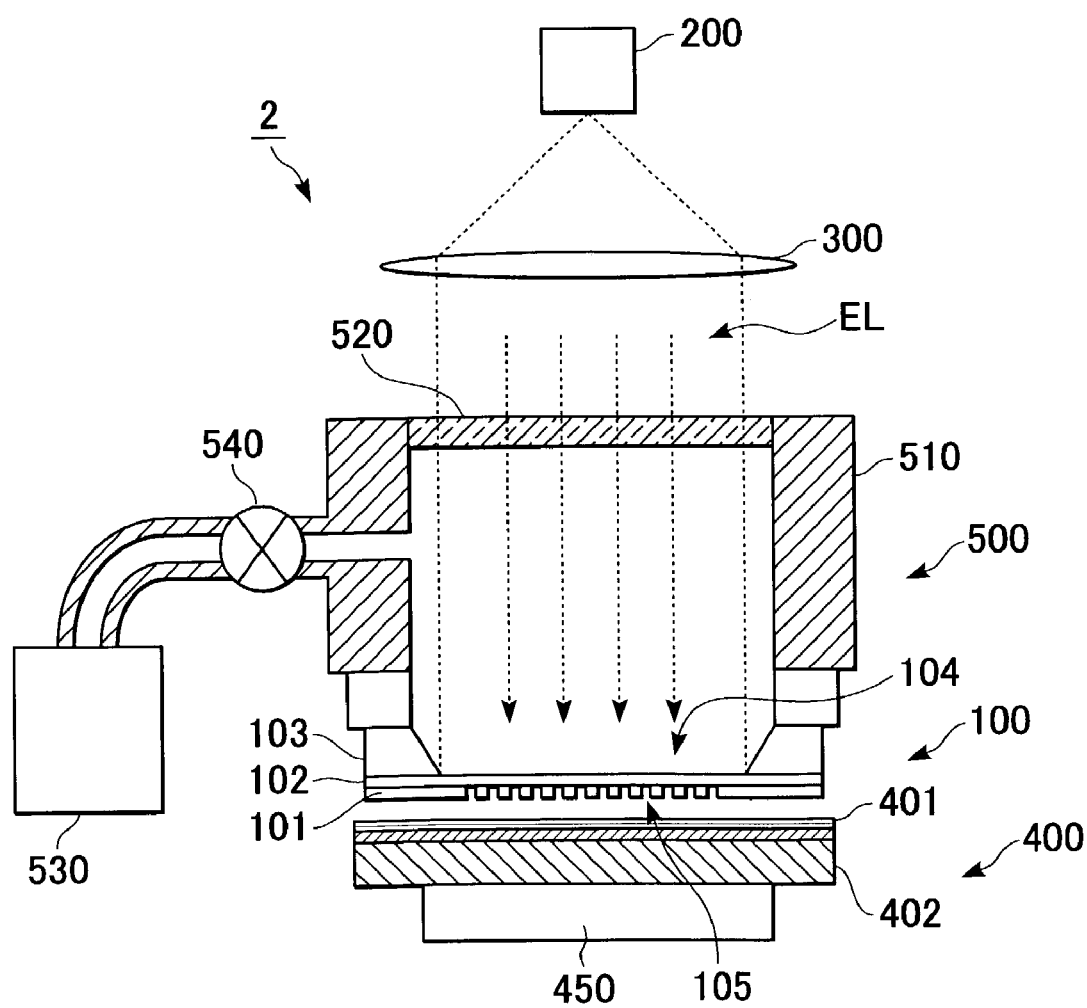
FIG. 3 is a schematic cross-sectional view showing an exposure apparatus of an embodiment according to the present invention.

Next, an example of an exposure apparatus 2 will be described which performs exposure using the exposure mask 1 described above. FIG. 3 is a schematic cross-sectional view showing the exposure apparatus 2 of this embodiment. As shown in FIG. 3, the exposure apparatus 2 comprises a light source portion 200, a collimator lens 300, an exposure mask 100 (equivalent to the exposure mask 1), a workpiece 400, and a pressure control device 500.

Next, major constituent elements of the exposure apparatus 2 will be described. The exposure apparatus 2 is formed so that a predetermined pattern formed in the exposure mask 100 is simultaneously exposed on the workpiece 400 at a transfer magnification of 1 by using the exposure mask 100 which may be applied to the entire surface of the workpiece 400. In this embodiment, various exposure methods, such as a step and repeat exposure method or a step and scan method may be performed, and in the step and repeat exposure method mentioned above, exposure is repeatedly performed on parts of the workpiece 400, which is moved in a stepwise manner, by using an exposure mask 100 smaller than the workpiece 400.

In the step and scan method mentioned above, the exposure mask 100 is disposed so as to oppose one of shot regions, each of which includes at least one chip area, formed on the workpiece 400; exposure light is continuously scanned for the exposure mask 100 and the workpiece 400 in a relative scanning motion so that a pattern of the exposure mask 100 is exposed on the workpiece 400; after the exposure is completed for the above one shot region, the workpiece 400 is moved in a stepwise manner so that another shot region on the workpiece 400, which is to be exposed, opposes the exposure mask 100; and the steps described above are repeated.

In addition, in the step and repeat exposure method, after each simultaneous exposure is completed for one shot region on the workpiece 400, the workpiece 400 is moved in a stepwise manner so that another shot region which is to be exposed is disposed at an exposure area (that is, a position opposing the exposure mask 100), and the above simultaneous exposure is repeated.

In this embodiment, when the step and scan exposure method or the step and repeat exposure method is performed, at each movement of the workpiece 400, the mask must be separated therefrom before the movement and must be closely brought into contact with the workpiece 400 after the stepwise movement.

The light source portion 200 has a function of generating light illuminating the exposure mask 100 having a circuit pattern to be transferred, and, for example, a mercury lamp emitting ultraviolet rays is used as a light source. The type of lamp is not limited to a mercury lamp, and a xenon lamp, a deuterium lamp, or the like, may also be used. The number of lamps also is not limited. In addition, a light source usable in the light source portion 200 is not limited to the lamp, and one or a plurality of lasers may also be used. For example, a laser emitting ultraviolet rays or soft X-rays may be used. An ArF excimer laser having a wavelength of approximately 193 nm, a KrF excimer laser having a wavelength of approximately 248 nm, an $F_2$ excimer laser having a wavelength of approximately 153 nm, or the like, may also be used. In addition, the type of laser is not limited to the excimer laser: a YAG laser may also be used, and the number of lasers is not also limited.

After the collimator lens 300 converts the light emitted from the light source portion 200 into parallel light and introduces it (i.e., the parallel light) inside a pressure chamber 510 of the pressure control device 500, the entire surface of the exposure mask 100 or a part thereof to be exposed is irradiated with the light with a uniform intensity.

As described above with reference to FIG. 1, the exposure mask 100 is composed of the shading film 101, the mask member 102, and the mask support 103, and from the shading film 101 and the mask member 102, the thin film portion 104 which is elastically deformable is formed. The exposure mask 100 transfers the pattern defined by the fine apertures 105 formed in the thin film portion 104 to a resist 401 at a transfer magnification of 1 by using near-field light (a transfer magnification of 1 does not mean to form a pattern having a size exactly the same as that of an original pattern, but means that the transfer is not performed by a reduced projection system). In the exposure mask 100, the lower side surface shown in FIG. 3 is the front surface of the mask, and the shading film 101 is disposed outside the pressure chamber 510 of the pressure control device 500. In addition, the thin film portion 104 is elastically deformed so as to be brought into close contact with fine irregularities on the surface of the resist 401 and undulations of the workpiece 400.

The workpiece 400 is formed of a substrate 402 such as a wafer and the photoresist 401 applied thereto, and is fixed on a stage 450. As the photoresist 401, a photoresist generally used in photolithography is used. In addition, a two-layered resist process may be used, and in this case, the photoresist 401 includes a lower resist and an upper resist. A process of applying the resist 401 comprises the steps of pretreatment, application of an adhesion-improving agent, application of the resist, and pre-baking. In addition, the two-layered resist process comprises the steps of pretreatment, application of an adhesion-improving agent, application of the lower resist, hard baking, application of the upper resist, and pre-baking. In the step of hard baking, the lower resist is cured by baking at a high temperature so as to prevent the dissolution of the lower resist while the upper resist is developed.

Figure 4C:
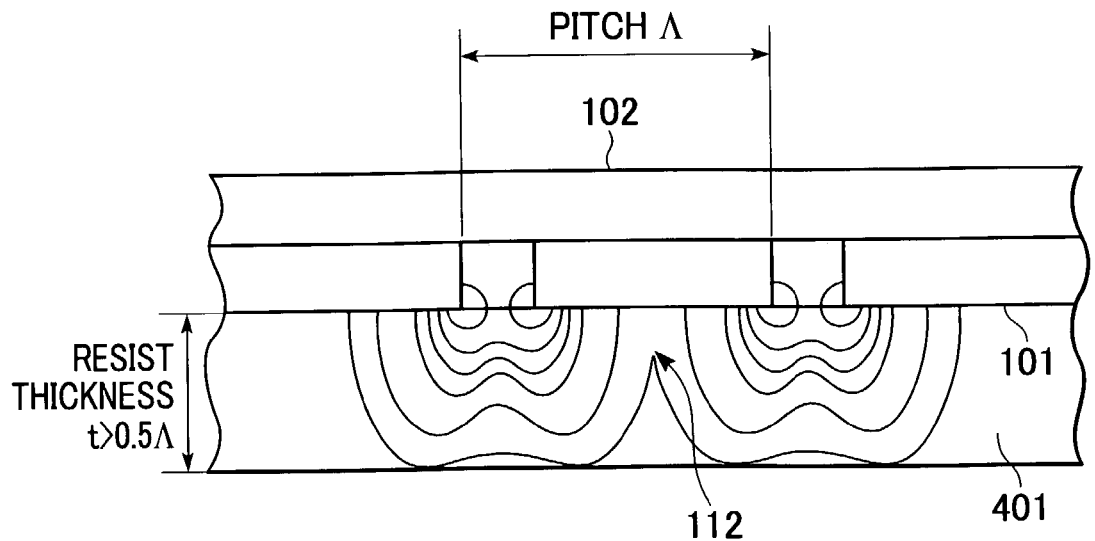
Figure 4D:
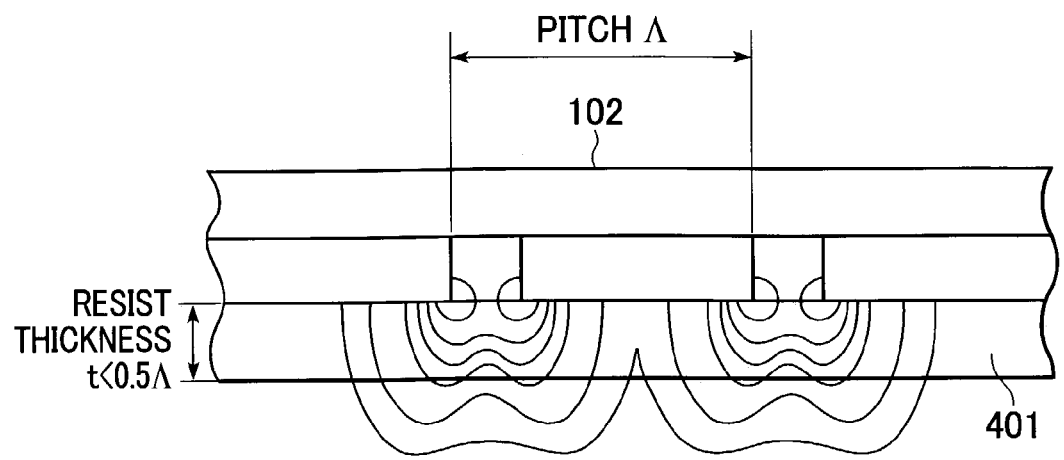
FIG. 4D is the case of the resist thickness smaller than 50% of the pitch Λ.

In this embodiment, since the near-field light effused from the aperture portion (i.e., apertures 105) formed in the exposure mask 100 is used, and the intensity thereof is exponentially decreased along directions away from the exposure mask 100, it has been difficult to expose the resist 401 to a depth of 100 nm or more from the surface thereof. In addition, when the exposure mask 1 shown in FIG. 1 is used, since the distribution of the intensity of near-field light spreads approximately isotropically from the apertures 105 formed in the exposure mask 1 in the direction of the normal line thereof and in the in-plane direction (see FIG. 4A), unless the thickness of the resist is controlled to be 50% or less of the pitch Λ between the apertures 105, near-field light effused from one aperture may overlap that effused from another aperture adjacent thereto. That is, when a resist having a thickness of 50% or more of the pitch Λ in the normal line direction of the mask is exposed, the intensity of the near-field light spreads approximately isotropically in the normal line direction of the mask and in the in-plane direction thereof as shown by isointensity lines 112 in FIG. 4C, the intensity of the near-field light at the bottom surface of the resist under the aperture portion and that under the shading portion become equal to each other. Hence, in the step of applying the resist and the step of applying the upper resist of the two-layered resist, the thickness of the resist must be 50% or less of the pitch Λ as shown in FIG. 4D, and a material for the resist 401 and a coating method must be selectively determined so that the thickness of the resist 401 and the irregularities of the surface thereof are each preferably approximately 10 nm or less, and are at least set to approximately 100 nm or less. For example, a method may be mentioned in which a general photoresist material is dissolved in a solvent so as to have a viscosity as low as possible and is applied by spin coating so as to have a small and uniform thickness.

For forming the substrate 402 which is to be processed, various materials may be used including semiconductor substrates such as silicon (Si), gallium arsenide (GaAs), and indium phosphide (InP); insulating substrates such as glass, quartz, and boron nitride (BN); and the substrates mentioned above coated with a metal, an oxide, a nitride, and the like. However, since the substrate is preferably brought into close contact with the exposure mask 100 over the entire exposure region with minute spaces of 10 nm or less, or at most 100 nm, therebetween, it is necessary for the substrate 402 to have a preferable flatness.

Since exposure is performed by using near-field light, the resist 401 and the front surface of the exposure mask 100 are disposed close to each other at a distance of approximately 100 nm or less from each other.

The stage 450 is driven by an external device, which is not shown in the figure, so as to align the workpiece 400 two-dimensionally and relatively with respect to the exposure mask 100 and to move the workpiece 400 up and down in the apparatus shown in FIG. 3. The stage 450 of this embodiment moves the workpiece 400 between an exposure position shown in FIG. 3 and a detachable position at which the workpiece 400 is placed and displaced. At the detachable position, the workpiece 400 to be exposed is placed on the stage 450, and the workpiece 400 exposed already is displaced therefrom.

By the pressure control device 500, superior close contact between the exposure mask 100 and the workpiece 400, and more specifically, between the thin film portion 104 and the photoresist 401, and the separation thereof can be easily performed. When both the surface of the exposure mask 100 and the surface of the resist 401 are perfectly flat, by contacting the two surfaces with each other, the exposure mask 100 and the resist 401 can be brought into close contact with each other over the entire surfaces thereof. However, in practice, since irregularities and undulations are present on the surface of the exposure mask 100 and the surfaces of the resist 401/the substrate 402, when both are simply brought into contact with each other, areas at which they are in close contact with each other and areas at which they are not in contact with each other are both present. At the areas at which the contacts are not obtained, since the workpiece 400 and the exposure mask 100 are not disposed in the range in which the near-field light does work, exposure irregularities may occur in some cases. Accordingly, in the exposure apparatus 2 of this embodiment, the pressure control device 500 comprises the pressure chamber 510, a light-transmitting window 520 formed of a glass or the like, pressure control means 530, and a pressure control valve 540.

The pressure chamber 510 can maintain its air tightness by the light-transmitting window 520, the exposure mask 100, and the pressure control valve 540. The pressure chamber 510 is communicated with the pressure control means 530 through the pressure control valve 540 so that the pressure inside the pressure chamber 510 can be controlled. The pressure control means 530 is formed, for example, of a high-pressure gas bottle, and hence the pressure inside the pressure chamber 510 can be increased by using the pressure control valve 540. In addition, the pressure control means 530 comprises an exhaust pump not shown in the figure, and the pressure inside the pressure chamber 510 can be decreased by using a pressure control valve not shown in the figure.

The close contact between the thin film portion 104 and the resist 401 can be obtained by controlling the pressure inside the pressure chamber 510. When irregularities and undulations on the surfaces of the exposure mask 100 and the resist 401/the substrate 402 are relatively large, the pressure inside the pressure chamber 510 is set to be relatively high so as to increase the contact force, thereby substantially removing the variation in spaces, caused by the irregularities and undulations, between the surfaces of the exposure mask 100 and the resist 401 the substrate 402.

Alternatively, the front surface side of the exposure mask 100 and the resist 401/the substrate 402 side may be disposed in a reduced-pressure chamber 510. In this case, due to the difference in pressure caused by an atmospheric pressure higher than that inside the reduced-pressure chamber, a pressure is applied from the rear surface side of the exposure mask 100 to the front surface side thereof, and as a result, the exposure mask 100 and the resist 401 can be brought into closer contact with each other. In both cases described above, the difference in pressure is obtained so that the pressure at the rear surface side of the exposure mask 100 is higher than that at the front surface side thereof. When the irregularities or undulations of the surfaces of the exposure mask 100 and the resist 401/the substrate 402 are relatively large, the contact force is increased by setting the pressure inside the reduced-pressure chamber 510 to be lower, and as a result, the variation in spaces between the mask surface and the resist/substrate surface can be substantially removed.

Furthermore, as still another alternative example, the inside of the pressure chamber 510 is filled with a liquid transparent with respect to exposure light EL, and the pressure of the liquid inside the pressure chamber 510 may be controlled by a cylinder not shown in the figure.

Next, a procedure of exposure using the exposure apparatus 2 will be described.

In exposure, the stage 450 aligns the workpiece 400 two-dimensionally and relatively with the exposure mask 100. After the alignment, the workpiece 400 is driven in the direction normal to the surface of the mask until the front surface side of the exposure mask 100 and the surface of the resist 401 are closely brought into contact with each other so that the minute spaces therebetween become 100 nm or less over the entire surface of the resist 401 when the thin film portion 104 is elastically deformed.

Subsequently, the exposure mask 100 and the workpiece 400 are brought into close contact with each other. In particular, after the pressure control valve 540 is opened, and the pressure control means 530 introduces a high-pressure gas into the pressure chamber 510 for increasing the pressure therein, the pressure control valve 540 is then closed. When the internal pressure of the pressure chamber 510 is increased, the thin film portion 104 is elastically deformed and pressed to the resist 401. As a result, the thin film portion 104 is brought into close contact with the resist 401 over the entire surface thereof with a uniform pressure so that near-field light will work. When the pressure is applied as described above, in accordance with Pascal's law, since a repulsive force acting between the thin film portion 104 and the resist 401 becomes uniform, a large force is not applied to limited parts of the thin film portion 104 and the resist 401, and as a result, the exposure mask 100 and the workpiece 400 will not be damaged locally.

The exposure is performed in the state described above. That is, exposure light, which is emitted from the light source portion 200 and is converted into parallel light by the collimator lens 300, is introduced in the pressure chamber 510 through the glass window 520. The light thus introduced passes through the exposure mask 100 disposed in the pressure chamber 510 from the rear surface side to the front surface side of the exposure mask 100, that is, from the upper side to the lower side in FIG. 3, and forms near-field light effused from the pattern defined by the fine apertures in the thin film portion 104. The near-field light is diffused in the resist 401, thereby exposing the resist 401. When the thickness of the resist 401 is sufficiently small, the near-field light is not so much diffused in the resist 401, and as a result, a pattern corresponding to the fine apertures smaller than the wavelength of the exposure light can transferred to the resist 401.

After the exposure, a valve not shown in the figure is opened, the pressure chamber 510 is exhausted through the exhaust pump, not shown in the figure, of the pressure control means 530 so that the pressure inside the pressure chamber 510 is decreased and, due to the elastic deformation, the thin film portion 104 is separated (or removed) from the resist 401. When the pressure is decreased as described above, in accordance with Pascal's law, since a repulsive force acting between the thin film portion 104 and the resist 401 becomes uniform, a large force is not applied to limited parts of the thin film portion 104 and the resist 401, and as a result, the exposure mask 100 and the workpiece 400 will not be damaged locally.

Subsequently, the workpiece 400 is moved to the detachable position at which the workpiece 400 is placed and displaced by the stage 450 and is replaced with a new workpiece 400, and the steps described above are then repeatedly performed.

Next, with reference to FIGS. 5 and 6, an example of a method for manufacturing a device using the exposure apparatus 2 described above will be described. FIG. 5 is a flow chart for illustrating a method for manufacturing a device (for example, a semiconductor device such as an IC or LSI; LCD; or CCD). In this embodiment, a method for manufacturing a semiconductor device will be described by way of example. In Step 1 (circuit design), circuit design is performed for the device. In Step 2 (mask formation), a mask having a circuit pattern thus designed is formed. In Step 3 (wafer formation), a wafer is formed using a material such as silicon. Step 4 (wafer process) is called a front-end process, and in this step, an actual circuit is formed on the wafer by a lithographic technique using the mask and the wafer. Step 5 (assembly) is called a back-end process in which semiconductor chips are formed from the wafer obtained in Step 4, and in which an assembly step (dicing and bonding), a packaging step (chip encapsulation), and the like, are performed. In Step 6 (inspection), inspections such as an operation test, an endurance test, and the like, are performed. After the steps described above, the semiconductor devices are completed and are then shipped (Step 7).

Figure 6:
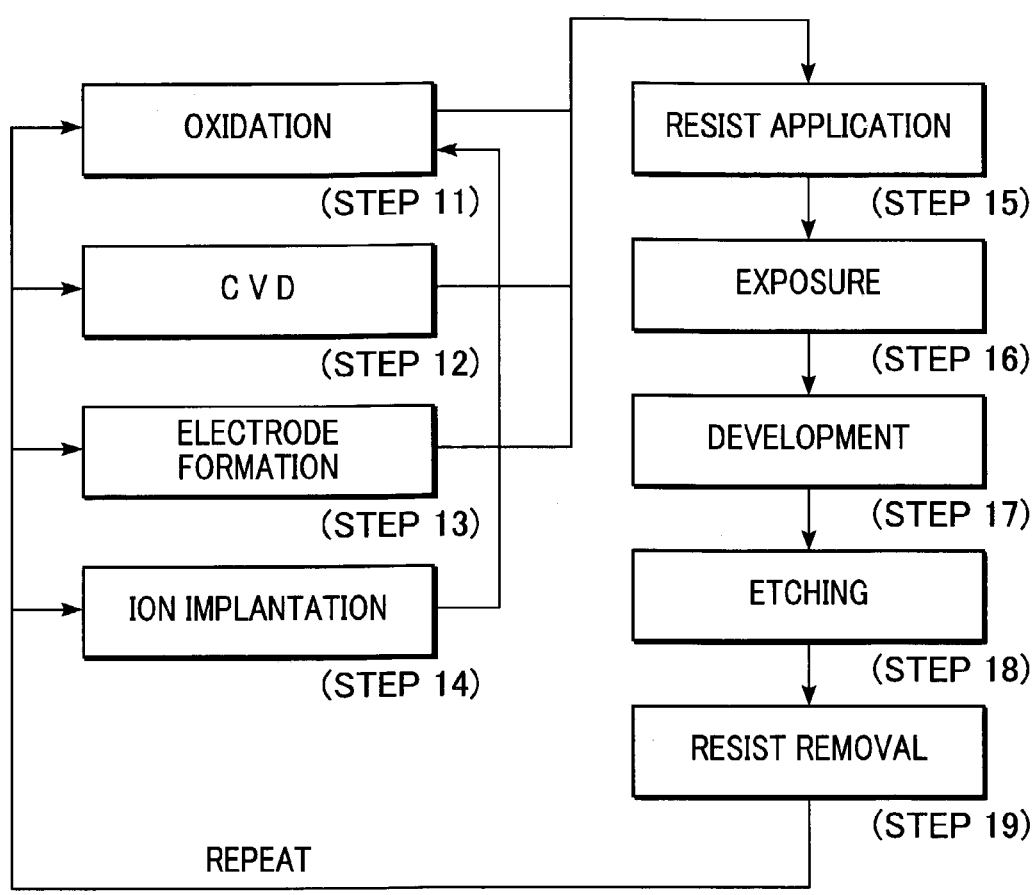
FIG. 6 is a detailed flow chart of step 4 shown in FIG. 5.

FIG. 6 is a detailed flow chart of the wafer process in Step 4. In Step 11 (oxidation), the surface of the wafer is oxidized. In Step 12 (CVD), an insulating film is formed on the surface of the wafer. In Step 13 (electrode formation), electrodes are formed on the wafer by deposition or the like. In Step 14 (ion implantation), ions are implanted in the wafer. In Step 15 (resist application), a photosensitive material is applied onto the wafer. In Step 16 (exposure), the circuit pattern of the mask is exposed to the wafer by the exposure apparatus 2. In Step 17 (development), the exposed wafer is developed. In Step 18 (etching), a part other than the resist image thus developed is etched. In Step 19 (resist removal), the unnecessary resist after etching is removed. By repeating the steps described above, a circuit pattern having a multilayer structure is formed on the wafer. According to the manufacturing method of this embodiment, a high quality device can be formed as compared to that formed in the past.

According to the present invention, even when a pattern formed in accordance with a further progressed (i.e., more advanced) finer design rule is used, a near-field light exposure mask capable of forming a resist pattern having a high aspect ratio can satisfy the requirements of the pattern described above. In addition, a method for manufacturing the near-field light exposure mask, an exposure apparatus and a method using the near-field light exposure mask, and a method for manufacturing a device by using the exposure apparatus can also be realized.

Hereinafter, examples of the present invention will be described.

EXAMPLE 1

Next, as Example 1 of the present invention, the case in which a 50-nm L & S structure was formed by exposure using the exposure mask 1 will be described.

In order to form the exposure mask, a Si wafer which was polished at both surfaces was first prepared as the mask support, and on each side of the Si wafer, a $Si_3N_4$ film having a thickness of only 5,000 Å was then formed, so that one of the $Si_3N_4$ films thus formed was used as a mask member. Subsequently, on this mask member, a Cr film having a thickness of only 500 Å was formed by sputtering as the shading film. Next, an electron beam resist was applied by spin coating, and a mask pattern was formed by an electron beam lithography apparatus. The pattern formed at this stage was an L & S having a pitch of 100 nm and a line width of 20 nm. After development, rinsing, and baking were performed, and dry etching was performed using a $CCl_4$ gas, thereby forming fine apertures in the shading film formed of Cr.

Next, a part of the $Si_3N_4$ film, 20 mm wide and 20 mm long, was then etched, which was formed on the opposite surface of the Si wafer from the shading film patterned as a mask, by photolithography and dry etching using a $CF_4$ gas. By using the remaining $Si_3N_4$ after etching as a mask, the Si present on an area corresponding to the mask was removed by etching using a KOH aqueous solution. According to the process described above, the mask supported by the Si wafer was formed.

The mask thus formed was placed in the exposure apparatus 2 shown in FIG. 3.

Before the mask and the workpiece were brought into close contact with each other, alignments were performed for both of them. Subsequently, compressed air was introduced into the pressure chamber by the pressure control means so that the pressure inside the chamber was higher than an atmospheric pressure by 40 kPa, thereby obtaining a difference in pressure between that at the front surface of the mask and that at the rear surface thereof.

Next, the mask, which was warped thereby, was uniformly brought into close contact with a resist having a thickness of 40 nm so that the space therebetween was decreased to approximately 100 nm or less. Subsequently, exposure light EL emitted from a light source was converted into parallel light, and the entire mask was irradiated therewith for exposure.

Next, when the mask is removed, the pressure inside the pressure chamber was decreased to be lower than an atmospheric pressure by 30 kPa using the pressure control means so that the pressure at the front surface of the mask was different from that at the rear surface thereof, and the thin film portion of the mask was then removed from the resist.

In this example, as a light source of the light source portion 200, mercury lamps emitting ultraviolet rays having wavelengths of 436 and 365 mm at high intensity were used. In addition, as the resist 401, a general resist photosensitive to the g line region (wavelength of 436 nm) was used.

In this example, numerical calculation of an electromagnetic field effused from the fine aperture was carried out, and by using the spread of the near-field light effused from the fine aperture obtained by the above calculation, the aperture width necessary for forming 50 nm L & S was determined to be 20 nm. As a method for determining the aperture width, in addition to the method described above, the following method may also be used in which exposure is performed once by using some exposure mask, a new exposure mask is then formed having an aperture width corrected in consideration of the spread of the resist pattern, and exposure is again performed, and in which through this process of trial and error, the correction value of the aperture width is finally determined.

EXAMPLE 2

Next, as Example 2 of the present invention, the case in which a 50 nm L & S structure was formed by exposure using the exposure mask 1 will be described.

In order to form the exposure mask, a Si wafer which was polished at both surfaces was first prepared as the mask support, and on each side of the Si wafer, a $Si_3N_4$ film having a thickness of only 5,000 Å was then formed, so that one of the $Si_3N_4$ films thus formed was used as a mask member. Subsequently, on this mask member, a Cr film having a thickness of only 500 Å was formed by sputtering as the shading film. Next, an electron beam resist was applied by spin coating, and a mask pattern was formed by an electron beam lithography apparatus. The pattern formed at this stage was an L & S structure having a pitch of 100 nm and a line width of 20 nm. After development, rinsing, and baking were performed, and dry etching was performed using a $CCl_4$ gas, thereby forming fine apertures in the shading film formed of Cr.

Next, a part of the $Si_3N_4$ film, 20 mm wide and 20 mm long, was then etched, which was formed on the opposite surface of the Si wafer from the shading film patterned as a mask, by photolithography and dry etching using a $CF_4$ gas. By using the remaining $Si_3N_4$ after etching as a mask, the Si present on an area corresponding to the mask was removed by etching using a KOH aqueous solution. According to the process described above, the mask supported by the Si wafer was formed.

The mask thus formed was placed in the exposure apparatus 2 shown in FIG. 3.

Before the mask and the workpiece were brought into close contact with each other, alignments were performed for both of them. Subsequently, compressed air was introduced into the pressure chamber by the pressure control means so that the pressure inside the pressure chamber was higher than an atmospheric pressure by 40 kPa, thereby obtaining a difference in pressure between that at the front surface of the mask and that at the rear surface thereof.

Next, the mask, which was warped thereby, was uniformly brought into close contact with a resist having a thickness of 40 nm so that the space therebetween was decreased to approximately 100 nm or less. Subsequently, exposure light EL emitted from a light source was converted into parallel light, and the entire mask was irradiated therewith for exposure.

Next, when the mask is removed, the pressure inside the pressure chamber was decreased to be lower than an atmospheric pressure by 30 kPa using the pressure control means so that the pressure at the front surface of the mask was different from that at the rear surface thereof, and the thin film portion of the mask was removed from the resist.

In this example, as a light source of the light source portion 200, mercury lamps emitting ultraviolet rays having wavelengths of 436 and 365 mm at high intensity were used. In addition, as the resist 401, a general resist photosensitive to the g line region (wavelength of 436 nm) was used.

The thickness of the resist used in this example was approximately 200 nm, and when the exposure was performed to the bottom of the resist, due to the thickness of the resist, near-field light effused from one aperture overlapped that effused from another aperture adjacent thereto, and as a result, the pattern could not be resolved. Accordingly, in this example, exposure was performed in the thickness direction of the mask to a level at which the mask pattern could be resolved, that is, the exposure was partly performed for the resist in the thickness direction thereof. In more particular, exposure was performed from the surface of the resist to a depth of 50 nm in the thickness direction, thereby forming a latent image in the resist.

After the exposure was performed, pre-baking for silylation was performed, and the silylation was performed only for the exposed portion by supplying vapor of hexamethyl disilazane (HMDS) at a temperature of 160° C. Subsequently, dry etching was performed using an $O_2$ gas so that an unexposed resist was etched, thereby forming a resist pattern having 50 nm L & S.

In this example, numerical calculation of an electromagnetic field effused from the fine aperture was carried out, and by using the spread of the near-field light effused from the fine aperture obtained by the above calculation, the aperture width necessary for forming 50 nm L & S was determined to be 20 nm. As a method for determining the aperture width, in addition to the method described above, the following method may also be used in which exposure is performed once by using some exposure mask, a new exposure mask is then formed having an aperture width corrected in consideration of the spread of the resist pattern, and exposure is again performed, and in which through this process of trial and error, the correction value of the aperture width is finally determined.

Except as otherwise disclosed herein, the various components shown in outline or in block form in the figures are individually well-known and their internal construction and operation are not critical either to the making or using of this invention or to a description of the best mode of the invention.

While the present invention has been described with reference to what are presently considered to be the preferred embodiments, it is to be understood that the invention is not limited to the disclosed embodiments. On the contrary, the invention is intended to cover various modifications and equivalent arrangements included within the spirit and scope of the appended claims. The scope of the following claims is to be accorded the broadest interpretation so as to encompass all such modifications and equivalent structures and functions.

What is claimed is:

1. A near-field light exposure mask comprising:
   a plurality of apertures, each having a width smaller than the wavelength of light used for exposure,
   wherein, among said plurality of apertures, apertures adjacent to each other are disposed at a predetermined distance so that near-field light generated from one of said apertures adjacent to each other does not overlap that generated from the other aperture of said apertures adjacent to each other, and
   wherein, for each of said plurality of apertures, the width of the aperture is at most 50% of the sum of (a) the width of the aperture and (b) the distance between said apertures adjacent to each other.

2. The near-field light exposure mask according to claim 1, wherein for each of said plurality of apertures, the width of the aperture is 50 nm or less.

3. The near-field light exposure mask according to claim 1, wherein for each of said plurality of apertures, the sum of (a) the width of the aperture and (b) the distance between said apertures adjacent to each other is 200 nm or less.

4. The near-field light exposure mask according to claim 1, wherein each of the apertures formed in said mask has a width smaller than the wavelength and has a length larger than the wavelength in a direction perpendicular to the width.

5. A method for manufacturing the near-field light exposure mask according to claim 1, said method comprising:
   a step of obtaining a spread of near-field light effused from each of the apertures formed in a mask; and
   a step of forming the width of each of the apertures so as to correct the spread of the near-field light.

6. The method according to claim 5, wherein said forming step is effected with respect to a mask different from that used in said obtaining step.

7. An exposure apparatus comprising a near-field light exposure mask provided with apertures therein, in which a workpiece is exposed by near-field light effused from each of the apertures,
   wherein the near-field light exposure mask is a near-field light exposure mask according to claim 1.

8. A method for manufacturing a device, said method comprising:
   a step of exposing a workpiece using an exposure apparatus according to claim 7; and
   a step of developing the workpiece.

9. An exposure method using a near-field light exposure mask provided with apertures therein, said method comprising the steps of:
   disposing the near-field light exposure mask close to a workpiece at a distance of 100 nm or less; and
   exposing the workpiece using near-field light effused from the apertures,
   wherein the near-field light exposure mask is a near-field light exposure mask according to claim 1.

10. The exposure method according to claim 9, wherein the thickness of the workpiece is 50% or less of the sum of (a) the aperture width and (b) the distance between the apertures adjacent to each other.

11. A method for manufacturing a device, said method comprising:
    a step of exposing a workpiece using the exposure method according to claim 10; and
    a step of developing the workpiece.

12. The exposure method according to claim 9, wherein the workpiece is partly exposed in the thickness direction.

13. A method for manufacturing a device, said method comprising:
    a step of exposing a workpiece using the exposure method according to claim 12; and
    a step of developing the workpiece.

14. A method for manufacturing a device, said method comprising:
    a step of exposing a workpiece using the exposure method according to claim 9; and
    a step of developing the workpiece.

15. A mask comprising:
    a film having formed therein a plurality of apertures including a first aperture having a width X and a second aperture having a width X separated by a distance D,
    wherein X is smaller than the wavelength of light used for exposure, and
    wherein the following condition is satisfied:

$X \leq (X+D)/2$.

16. The mask according to claim 15, wherein $X \leq 50$ nm.

17. The mask according to claim 16, wherein $X+D \leq 200$ nm.

18. The mask according to claim 17, wherein said film is formed of Cr, Al, or Au,
    wherein said mask further comprises a mask member formed of SiN, $SiO_2$, or SiC, and
    wherein said plurality of apertures are in the form of a slit or circle.

19. The mask according to claim 17, wherein said plurality of apertures have a width smaller than that of a resist pattern to be formed in a workpiece.

20. An exposure apparatus comprising:
    a mask according to claim 15; and
    means for exposing a workpiece with light effused from said plurality of apertures.

* * * * *